(12) United States Patent
Shaeffer

(10) Patent No.: US 7,248,628 B2
(45) Date of Patent: Jul. 24, 2007

(54) METHOD AND APPARATUS FOR A PROGRAMMABLE FILTER

(76) Inventor: Derek K. Shaeffer, 515 Quartz St., Redwood, CA (US) 94062

( * ) Notice: Subject to any disclaimer, the term of this patent is extended or adjusted under 35 U.S.C. 154(b) by 1049 days.

(21) Appl. No.: 09/798,727

(22) Filed: Mar. 2, 2001

(65) Prior Publication Data

US 2004/0071244 A1    Apr. 15, 2004

(51) Int. Cl.
*H03H 7/30* (2006.01)

(52) U.S. Cl. .................... 375/229; 375/350

(58) Field of Classification Search ........ 375/150, 375/152, 343, 350, 285, 296, 247–248, 346; 341/110, 126, 155, 120, 118, 140, 131, 143, 341/162, 142; 327/124, 126, 164; 708/300, 708/317, 313, 422, 423
See application file for complete search history.

(56) References Cited

U.S. PATENT DOCUMENTS

| | | | |
|---|---|---|---|
| 3,953,795 A | | 4/1976 | Brunner et al. |
| 4,281,318 A | * | 7/1981 | Candy et al. .............. 341/61 |
| 4,855,685 A | * | 8/1989 | Hochschild ............... 330/282 |
| 4,857,928 A | | 8/1989 | Gailus et al. |
| 5,157,343 A | | 10/1992 | Voorman |
| 5,179,380 A | | 1/1993 | White |
| 5,196,852 A | * | 3/1993 | Galton ....................... 341/143 |
| 5,323,157 A | * | 6/1994 | Ledzius et al. ........... 341/143 |
| 5,345,406 A | | 9/1994 | Williams |
| 5,534,827 A | * | 7/1996 | Yamaji ...................... 332/103 |
| 5,557,642 A | | 9/1996 | Williams |
| 5,561,425 A | * | 10/1996 | Therssen .................. 341/143 |
| 5,594,612 A | * | 1/1997 | Henrion .................... 341/120 |
| 5,712,635 A | * | 1/1998 | Wilson et al. ............. 341/144 |
| 5,734,683 A | | 3/1998 | Hulkko |
| 5,736,950 A | | 4/1998 | Harris et al. |
| 5,745,061 A | * | 4/1998 | Norsworthy et al. ...... 341/131 |
| 5,760,722 A | | 6/1998 | Harris et al. |
| 5,841,814 A | | 11/1998 | Cupo |
| 5,862,069 A | | 1/1999 | Nestler |
| 5,963,160 A | * | 10/1999 | Wilson et al. ............. 341/143 |
| 6,005,506 A | | 12/1999 | Bazarjani et al. |
| 6,064,871 A | | 5/2000 | Leung |
| 6,075,474 A | * | 6/2000 | Gabet et al. .............. 341/143 |
| 6,094,458 A | | 7/2000 | Hellberg |
| 6,097,251 A | | 8/2000 | Khullar et al. |
| 6,285,306 B1 | * | 9/2001 | Zrilic ........................ 341/143 |
| 6,370,184 B1 | * | 4/2002 | Hellberg ................... 375/150 |
| 6,590,512 B2 | * | 7/2003 | Roh et al. ................. 341/143 |

FOREIGN PATENT DOCUMENTS

EP     381764 B1    8/1990

(Continued)

OTHER PUBLICATIONS

E.S. Poberezhskiy and M.V. Zarubinskiy, "Sample-and-Hold Devices Employing Weighted Integration in Digital Radio Receivers," Electronic Circuits (1990), pp. 75-79.

(Continued)

*Primary Examiner*—Khanh Tran
(74) *Attorney, Agent, or Firm*—Brinks Hofer Gilson & Lione

(57) ABSTRACT

A system includes a sampling circuit, an analog filter, an analog input, a modulator, and a modulating source. The modulating source includes an output that generates an impulse response encoded as a sigma-delta sequence. The output of the modulating source is coupled to the modulator, which is coupled to the analog input. The analog filter is coupled to the modulator and the sampling circuit. When the system is configured as a filter, an analog signal is modulated with the sigma-delta sequence. The modulated signal is filtered and then sampled.

33 Claims, 10 Drawing Sheets

FOREIGN PATENT DOCUMENTS

| EP | 398981 B1 | 11/1990 |
|---|---|---|
| EP | 461720 A1 | 12/1991 |
| EP | 461720 B1 | 12/1991 |
| EP | 464500 A2 | 1/1992 |
| EP | 464500 A3 | 1/1992 |
| EP | 464500 B1 | 1/1992 |
| EP | 589090 A1 | 3/1994 |
| EP | 607712 A1 | 7/1994 |
| EP | 628229 B1 | 12/1994 |
| EP | 643477 A2 | 3/1995 |
| EP | 643477 A3 | 3/1995 |
| EP | 643477 B1 | 3/1995 |
| EP | 650261 A1 | 4/1995 |
| EP | 863606 A1 | 9/1998 |

OTHER PUBLICATIONS

Y. Poberezhskiy and G. Poberezhskiy, "Sample-and-Hold Amplifiers Performing Internal Antialiasing Filtering and Their Applications in Digital Receivers," Telecommunications and Radio Engineering, Scripta Technica, Inc., vol. 44, No. 8, Aug. 1989, pp. 1-4.

Enyde, F. Op't, "A Power Metering ASIC with a Sigma-Delta-Based Multiplying ADC," Proceedings of the IEEE International Solid-State Circuits Conference, Feb. 1994, pp. 186-187.

Gilbert, Barrie, "A Precise Four-Quadrant Multiplier with Subnanosecond Response," IEEE Journal of Solid-State Circuits, vol. SC-3, No. 4, Dec. 1968, pp. 365-373.

Khairy, M., et al., "A New Digital Correlator for Bandlimited Direct Sequence Spread Spectrum Signals," IEEE, pp. 1894-1898 (1995).

Khairy, M., et al., "A New Technique for the Correlation of Bandlimited Direct Sequence Spread Spectrum Signals," Proceedings of the Sixth IEEE International Symposium on Personal, Indoor and Mobile Radio Communications, Sep. 1995, pp. 1272-1276.

Norsworthy, S.R., et al., Delta-Sigma Data Converters Theory, Design, and Simulation; An Overview of Basic Concepts/J. C. Candy, IEEE Press, 1997, Chapter 1, pp. 1-43.

Wong, P.H., et al., "FIR Filters with Sigma-Delta Modulation Encoding," IEEE Transactions on Acoustics, Speech, and Signal Processing, vol. 38, No. 6, Jun. 1990, pp. 979-990.

Wozencraft and Jacobs, Principles of Communications Engineering, John Wiley and Sons, 1965, Chapter 4, pp. 233-239.

\* cited by examiner

METHOD AND APPARATUS FOR A PROGRAMMABLE FILTER

BACKGROUND

Many applications require the filtering and subsequent sampling of analog signals. For example, in communications receivers, an analog signal comprising a desired signal, interfering signals, and noise may first be filtered to select the desired signal from among the other undesired signals so that subsequent signal processing may be performed without distortion. Examples of some conventional filters include L-C filters, surface acoustic wave filters, and ceramic filters. Many of these filters are costly, bulky, or difficult to miniaturize. The filters can further lack programmability, which is often desirable. There are other examples of conventional filters that lend themselves to miniaturization in integrated circuits. These include Gm-C filters, MOSFET-C filters, Sallen & Key filters, and others. Many of these consume an unacceptable amount of power or lack the performance required for many applications. Therefore, it would be useful to identify a filter technique that overcomes these conventional limitations.

One technique for filtering and sampling an analog signal is based on sampled correlators as found, for example, in "Principles of Communications Engineering," by Wozencraft and Jacobs. The system, illustrated in FIG. 1, accepts a received signal "x(t)" 102 that is combined with a correlating signal, "h(t−kT)" 108 using a bilinear analog multiplier 104, where "t" is an increment in time, "k" is an integer, and "T" is a desired sampling interval. The output of the multiplier 104 is filtered and sampled at a periodic interval "kT," where "k" is an integer and "T" is the desired sampling interval The resulting output signal, "y[k]," 106 is a discrete-time representation of the filtered analog signal.

An advantage of the system illustrated in FIG. 1 is that filtering and sampling is performed computationally with components that are readily miniaturized. However, the system is not without disadvantages. For example, it is sometimes difficult to build an accurate analog multiplier 104. Without an accurate analog multiplier 104, the performance of this system is often limited. One technique for building analog multipliers is taught by Gilbert in "A Precise Four-Quadrant Multiplier with Subnanosecond Response." However, Gilbert's technique lacks the necessary accuracy for many applications.

The difficulty of building analog multipliers is also recognized in other publications and other United States and European Patents. U.S. Pat. No. 3,953,795 to Brunner, for example, discloses an electric power meter implementing an analog multiplier using a commutating mixer driven by a two-level pulse width modulator. Eynde, in "A Power Metering ASIC with a Sigma-Delta-Based Multiplying ADC," discloses an electric power meter with a commutating mixer which uses a special type of pulse width modulator. Eynde's structure is substantially disclosed in European Patent Off. No. 589,090. U.S. Pat. No. 5,862,069 to Nestler, eliminates analog multiplication problems by performing multiplication in the digital domain after modulating both input signals. Accordingly, there is a need for an apparatus and method that can produce accurate correlation and, hence, filtering of an analog signal in a manner that lends itself to miniaturization within integrated circuits.

SUMMARY

The present invention is defined by the following claims, and nothing in this section should be taken as a limitation on those claims.

By way of introduction, the preferred embodiments described below provide a method and a system for filtering an analog signal. In one preferred embodiment configured as a filter, the method encodes an impulse response into a one-bit sigma-delta sequence. The sigma-delta sequence modulates an analog signal. The modulated analog signal is filtered and then sampled.

In another preferred embodiment, the system includes a sampling circuit, an analog filter, an analog input, a modulator, and a modulating source. The modulating source includes an output that generates an impulse response encoded as a sigma-delta sequence. The output of the modulating source is coupled to the modulator, which is coupled to the analog input. The analog filter is coupled to the modulator and the sampling circuit.

The preferred embodiments will now be described with reference to the attached drawings.

DETAILED DESCRIPTION OF THE PRESENTLY PREFERRED EMBODIMENTS

The method and apparatus of this preferred embodiment combine an analog signal with a correlating signal. The processing of these signals generates a desired response that correlates to the analog signal. The method and apparatus of this preferred embodiment can be used in specialized and general-purpose communication systems and can be produced using relatively inexpensive circuits or implemented within an integrated circuit. Furthermore, the method and apparatus of this preferred embodiment can be programmable.

Figure 1:
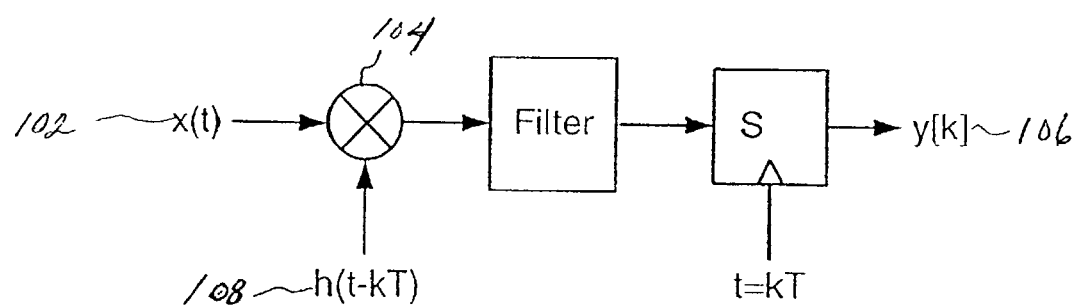
FIG. 1 is a block diagram of a prior art correlator.
Figure 2:
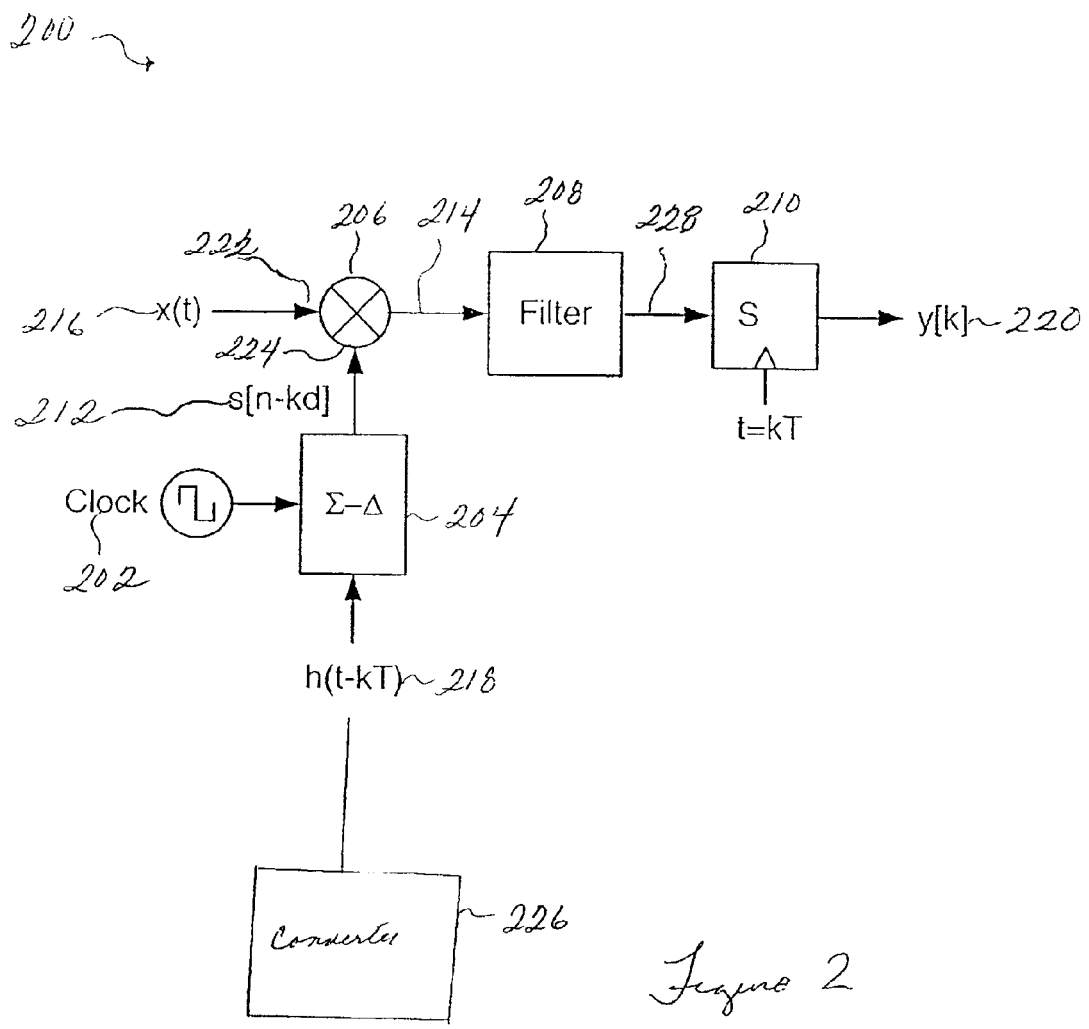
FIG. 2 is a block diagram of a preferred embodiment.

FIG. 2 is a partial block diagram of a preferred embodiment 200. The preferred embodiment 200 preferably includes a clock 202, a sigma-delta modulator 204, a commutating modulator 206, a filter 208, and a sampling circuit 210. The sigma-delta modulator 204, which is also known as a delta-sigma modulator, generates a control signal, 212, which comprises a correlation sequence that is also known as a sigma-delta sequence "s(n−kd)," where "n" is an index, "k" is an integer, and "d" is a delay in time. The control signal 212 is a one-bit signal received by the commutating modulator 206, which is also known as a switching modulator. The sigma-delta modulator 204 is driven by a serial stream of periodic pulses generated by the clock 202, which defines, in part, the operating speed of the sigma-delta modulator 204.

A commutated signal 214 is generated by the commuting modulator 206. The commutated signal 214 is conditioned by the filter 208 and is then sampled by a sampling circuit 210. In this preferred embodiment 200, a selectable sampling rate is programmed at a periodic interval "kT," where "k" is an integer and "T" is a desired sampling interval. The discrete output of the sampling circuit 210 is the correlation of an analog signal "x(t)" 216 and a correlating signal 218. In a preferred embodiment, where the filter 208 is an integrating filter, the output response is a Fourier transform of the time-reversed sigma-delta sequence. When the correlating signal 218 is matched to the analog signal 216, the output response is a matched-filter response. The control signal 212 is comprised of a desired signal and, in some embodiments, a parasitic signal. The parasitic signal includes quantization noise created by the sigma-delta modulator.

Figure 3:
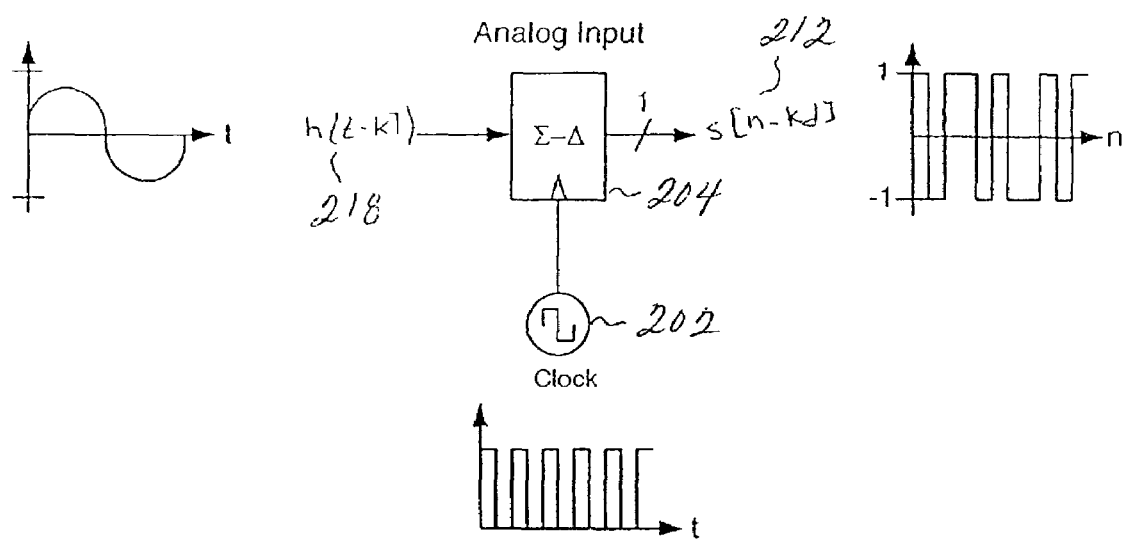
FIG. 3 is a block diagram of a sigma-delta modulator of FIG. 2.
Figure 4:
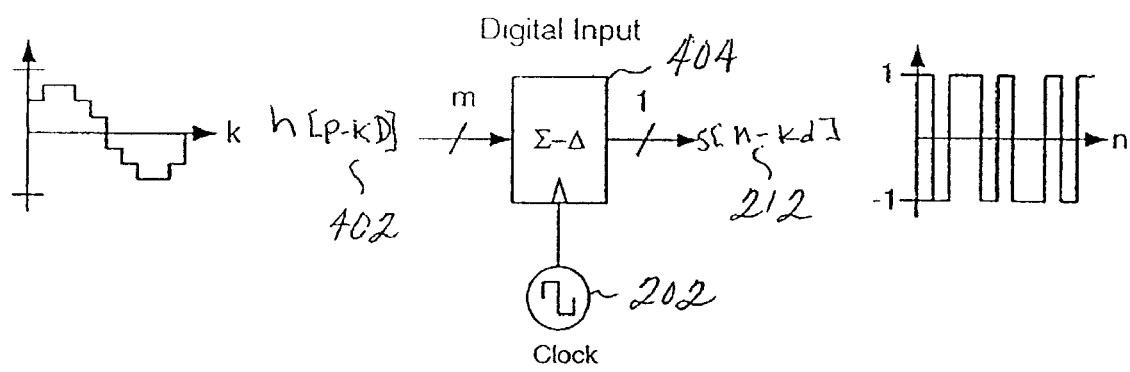
FIG. 4 is a block diagram of an alternative sigma-delta modulator of FIG. 2.

FIGS. 3 and 4 illustrate two exemplary sigma-delta modulators that can be interfaced to the commutating modulator 206. The sigma-delta modulator 204 illustrated in FIG. 3 receives the analog signal correlating "h(t–kT)" 218 which is a waveform that has a continuous range of values in the time domain. The sigma-delta modulator 204 has two quantizing levels which produces a one-bit discrete output. The one-bit discrete output represents the quantized analog correlating signal "h(t–kT)" where "t" is an increment in time, "k" is an integer, and "T" is the desired sampling interval. The second sigma-delta modulator 404 illustrated in FIG. 4 receives an m-bit digital signal "h[p–kD]" 402 at a digital input, which is preferably the digital representation of the correlating signal "h(t–kT)" 218. In this case, "p" is a time index, "k" is an integer, and "D" is a delay index corresponding to the desired sampling interval. The second sigma-delta modulator 404 also generates a one-bit discrete output 212. A programmable sigma-delta modulator having a programmable input may also be used in alternative digital and analog signal modulating embodiments. The programmable sigma-delta modulator can be used in multi-mode communication embodiments or in other preferred embodiments that generate more than one filter shape. When using any digital sigma-delta modulator, the desired correlating signal 402 "h[p–kD]" or function can be digitally computed, eliminating the need for digital-to-analog converters interfaced to or integrated within the digital sigma-delta modulator 404.

In FIG. 2, the output 212 of the sigma-delta modulator 204 comprises the filtered and quantized correlating signal 218 and the parasitic signal, which includes quantization noise. In this preferred embodiment 200, the quantization noise lying within a desired frequency band is suppressed by a quantization noise-shaping method or circuit within the sigma-delta modulator 204. Moreover, by pre-filtering the analog signal "x(t)" 216, the signal components lying outside a desired frequency band can be suppressed before being commutated by the commutating modulator 206. Accordingly, a filter output response of this preferred embodiment 200 accurately matches a desired response. Moreover, the accuracy of the output response 220 does not depend on the tolerances of any pre-filters because a sampling clock interfaced to or integrated within the sigma-delta modulator 204 generates sampling pulses at a much higher frequency than the highest frequency of the correlating signal "h(t–kT)" 218. Depending on the architecture of the sigma-delta modulator 204, the sigma-delta modulator 204 can sample at a factor higher than the highest correlating signal frequency "h(t–kT)," (e.g., factor * "h(t–kT)"). This process, referred to as over-sampling, enhances the resolution of the control signal 212. The use of over-sampling relaxes the tolerances of any pre-filters.

The output response 220 realized by the preferred embodiment 200 of FIG. 2 can match many filter responses. Baseband, lowpass, and bandpass filter responses, for example, can be created. Thus, the control signal 212 received by the commutating modulator 206 may include a baseband or bandpass characteristic. The filter responses preferably depend on the impulse response or correlation function encoded within the sigma-delta sequence or the control signal 212. In some preferred embodiments, the process is referred to as correlation processing.

To achieve linearity, the commutating modulator 206 is controlled by a one-bit binary output 212 of the sigma-delta modulator 204. In this preferred embodiment 200, the commutating modulator 206 has exactly two switching levels that create a very precise filter response 220. Accordingly, the preferred embodiment 200 does not suffer from the integral and differential non-linearities that limit the accuracy of some modulators that have more than two switching states. Moreover, in an alternative preferred embodiment the switching or commutating modulator 206 can comprise a switched-gain amplifier.

The commutating modulator 206 in this preferred embodiment 200 has at least two signal inputs: an analog input 222 and a control input 224. The analog signal "x(t)" 216 is received at the analog input 222, and the control signal 212 is received at the control input 224. The control signal 212 controls the switching state of the commutating modulator 206.

The filter and sampling circuits 208 and 210 shown in FIG. 2 encompass many other analog filters and sampling circuits. In one preferred embodiment, the filter 208 is an integrate-and-dump lowpass filter that filters the commutated signal 214. In an alternative preferred embodiment, a lowpass filter or an integrator that periodically resets filters the commutated signal 214. In these preferred embodiments, the sampling circuit 210 is preferably a lowpass sample-and-hold circuit, and the correlating signal 218 is preferably a baseband signal generated by a digital-to-analog converter 226. In alternative preferred embodiments, the correlating signal 218 may be generated by other sources.

In another alternative preferred embodiment, the filter 208 is a resonate-and-dump bandpass filter. In this preferred embodiment, the correlating signal 218 is programmed, addressed, or generated at a desired frequency. In other preferred embodiments, the filter 208 can be a resonator or a bandpass filter that periodically resets. In these preferred embodiments, the sampling circuit 210 is preferably a bandpass sample-and-hold circuit that samples and holds an envelope of the filtered commutated signal 228 while preserving carrier oscillations. The sigma-delta modulator 204 modulates a bandpass signal with a carrier frequency equal to the frequency of the correlating signal, plus or minus the resonance frequency of the resonator. Because the output signal "y[k]" 220 includes a carrier frequency component generated by the filter and the sampling circuits 208 and 210, an implicit frequency translation of the analog signal "x(t)" 216 occurs. Accordingly, the carrier frequency component at the output of the filter 208 is not determined by the carrier frequency of the analog signal "x(t)" 216.

Figure 5:
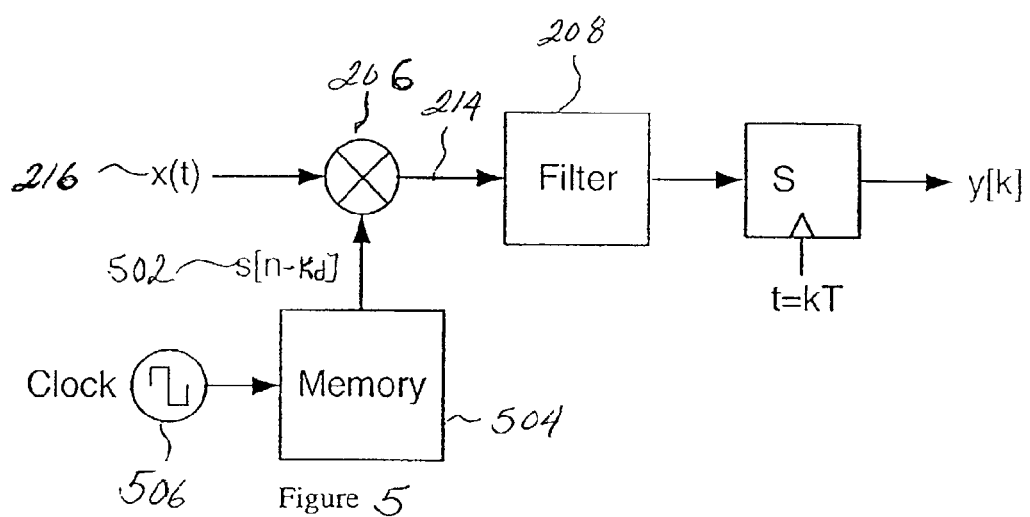
FIG. 5 is a block diagram of an alternative preferred embodiment.

In a second preferred embodiment 500 shown in FIG. 5, the correlating signal 502 is a programmed signal. In this preferred embodiment 500, multiple sigma-delta sequences or control signals 502 encode different impulse responses or different correlation functions. These sequences can be generated in real time and synchronized to the analog signal "x(t)" 216 or stored in a memory 504.

As shown in FIG. 5, the memory 504 is programmed with the control signals 502 that include a sigma-delta sequence and/or sequences that were previously calculated. The memory 504 can be volatile and hold control signals 502 temporarily as with random access memory (RAM) and dynamic random-access memory (DRAM), for example, or nonvolatile and hold data permanently such as with read only memory (ROM), erasable programmable read only memory (EPROM), electrically erasable programmable read only memory (EEPROM), or a programmable read only memory (PROM), for example. Many other types of memory can also be used.

The memory 504 shown in FIG. 5 is directly accessed by a clock 506 through an internal bus. The memory cells within the memory 504 store one-bit correlation or sigma-delta sequences "s[n]" 502. When a sigma-delta sequence "s[n]" 502 is selected, the commutating modulator 206 selects between two switching levels, which determines the impulse response of this preferred embodiment 500. By using memory 504 instead of an explicit sigma-delta modulator, this preferred embodiment 500 saves energy.

The preferred embodiment shown in FIG. 5 computes output samples at a sampling rate of "kT" that can be defined by the time duration of the impulse response or, equivalently, the duration of the sigma-delta sequence "s[n]" 502. After calculating a sample, the filter 208 is reset to process a successive commutated signal 214. When the duration of the sigma-delta sequence "s[n]" 502 extends through multiple output sample periods, parallel processing may be used, as shown in FIG. 6.

Figure 6:
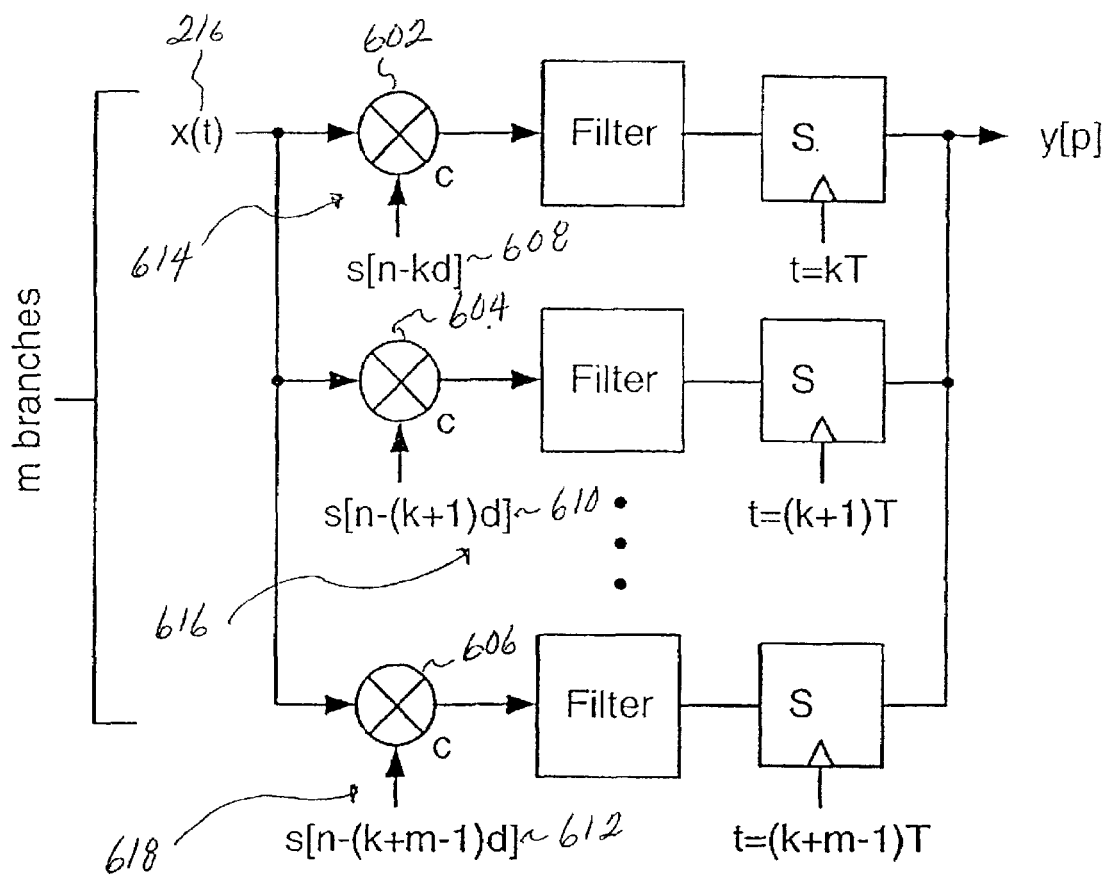
FIG. 6 is a partial block diagram of an alternative preferred embodiment.

In FIG. 6, the analog signal "x(t)" 216 is concurrently received by multiple commutating modulators 602, 604, and 606. The control inputs of the sigma-delta modulators are driven by sigma-delta sequences 608, 610, and 612 that may be generated by one or more sigma-delta converters or by a memory retaining sigma-delta sequences 608, 610, and 612 or by other means. As shown in FIG. 6, the sigma-delta sequences 608, 610, and 612 are successively delayed functions of a first sigma-delta sequence "s[n]" or sequence "s[n-kd]" 608. In alternative preferred embodiments, other multiple sequences sigma-delta sequences "s[n]" can be used in place of the illustrated successive sequences 608, 610, and 612. When the embodiment of FIG. 6 is incorporated into a communication receiver, the communication receiver is referred to as a correlation receiver.

In one exemplary embodiment of FIG. 6 having "m" branches, each branch computes an output sample every "kT" seconds, where "k" is an integer selected from the set consisting of or comprising { ... −2m, −m, 0, m, 2m ... }, and "T" is the desired sampling interval. In a first branch 614, the illustrated correlation receiver computes samples at times ..., −2mT, −mT, 0, mT, 2mT, ... In a second branch 616, samples are computed at times ..., (−2m+1)T, (−m+1)T, T, (m+1)T, (2m+1)T, ... In a last branch 618, samples are computed at times ..., (−m−1)T, −T, (m−1)T, (2m−1)T, (3m−1)T, ... Accordingly, the first branch 614 calculates a first sample, the second branch 616 calculates a second sample, etc. The last branch 618 calculates the $m^{th}$ sample, and the following $(m+1)^{th}$ sample is again calculated by the first branch 614. Samples are sequentially calculated in this manner by repeatedly cycling through the "m" branches. Of course, the number of branches "m" in alternative embodiments will vary. Preferably, the number of branches "m" is calculated by comparing the duration of the sigma-delta sequences against the sampling intervals. Specifically, the number of branches "m" can be calculated by Equation 1

$$m = \text{length}(s) \div (f^*T) \qquad \text{(Equation 1)}$$

where "f" is the clock rate for the sigma-delta sequences, and the length(s) are the lengths of the sigma-delta sequences. In this preferred embodiment, the appropriate number of branches "m" is a rounded up integer.

Each branch shown in FIG. 6 correlates the analog input signal "x(t)" 216 to a delayed sigma-delta sequence. The delay "d" specifies the spacing interval between adjacent branches. The first branch 614 has a delay of k*d, the second branch 616 has a delay of (k+1)*d, ..., and the last branch 618 has a delay of (k+m−1)d. The delay "d" can be calculated by Equation 2

$$d = (f^*T) \qquad \text{(Equation 2)}$$

where "f" is the clock rate of the sigma-delta sequences and "T" is the desired sampling interval. When the delay "d" is an integer, Equation 2 requires a clock frequency of a sigma-delta modulator to be an integer multiple of the output sampling frequency. It should also be noted that the number of branches "m" can also be calculated by Equation 3.

$$m = \text{length}(s) \div d \qquad \text{(Equation 3)}$$

The sigma-delta sequences described in the above-preferred embodiments comprise encoded representations of desired correlating functions and impulse responses that result in very high-resolution filter responses. This encoding may generate sigma-delta sequences through a sigma-delta converter 226, by accessing sigma-delta sequences stored in memory 504, or by other programming methods.

Figure 7:
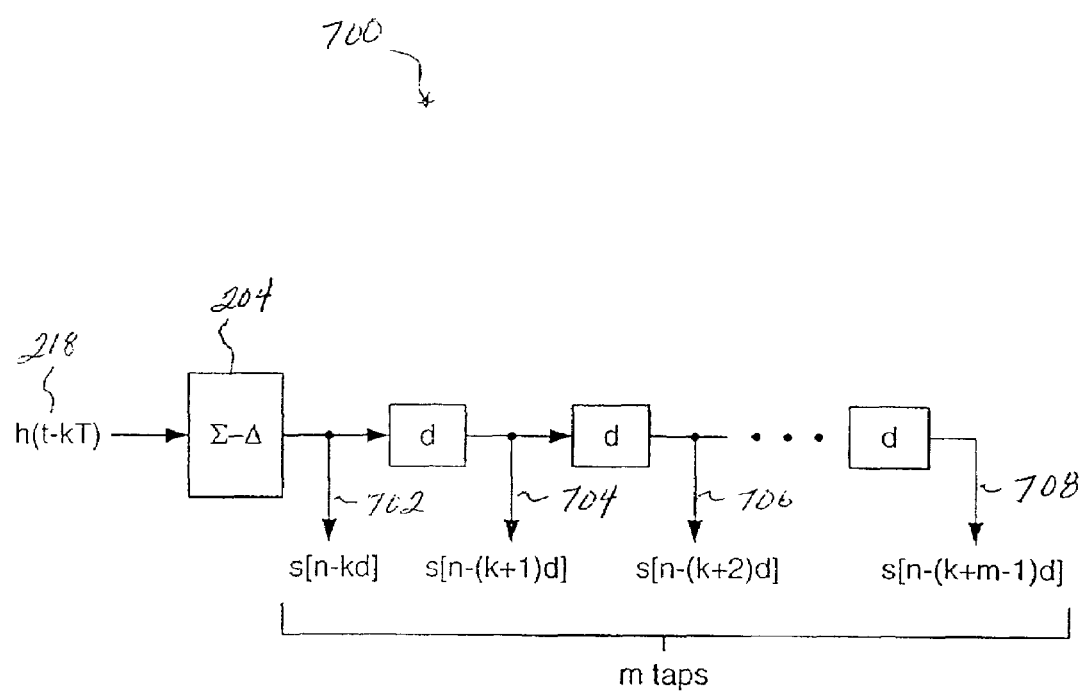
FIG. 7 is a block diagram of a method that generates sigma-delta sequences of FIG. 6.

Delayed sigma-delta sequences can be derived in many ways. In FIG. 7, multiple phases of the sigma-delta sequence are derived through a tapped delay of an output of a sigma-delta modulator 204. Each tap 702, 704, 706, and 708 is delayed by "d" clock cycles with respect to its preceding tap. The delayed taps are coupled to commutating modulators, such as those shown in FIG. 6. Although this preferred embodiment 700 illustrates a derivation of sigma-delta sequences using the analog correlating signal, "h(t−kT)" 218, in alternative preferred embodiments, a discrete correlating function "h[n−kD]" 402 can also be used.

Figure 8:
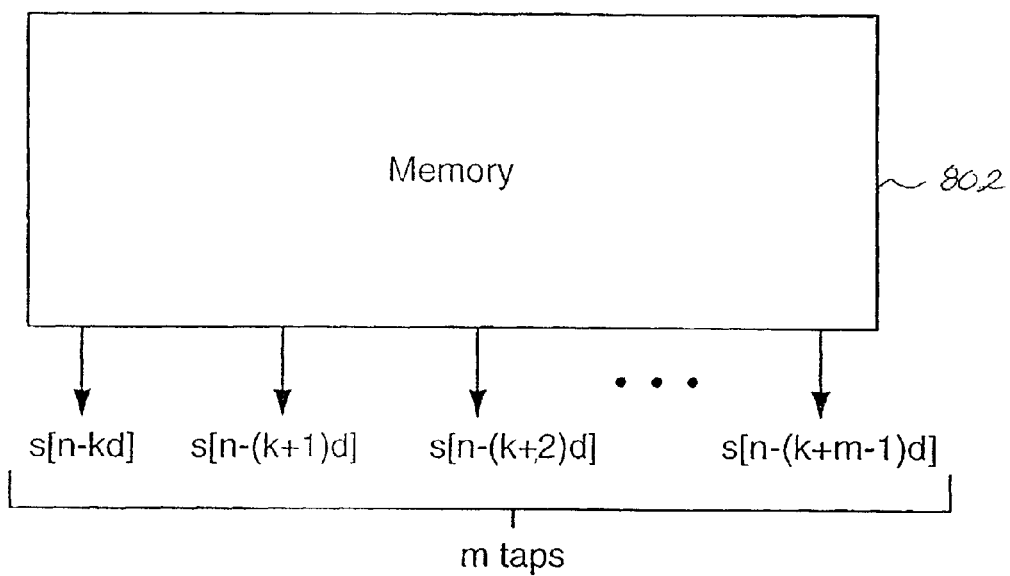
FIG. 8 is a block diagram of a memory that generates sigma-delta sequences of FIG. 6.

Many other alternatives for deriving the delayed sigma-delta sequences are also possible. As shown in FIG. 8, a memory 802 is programmed with desired delayed sigma-delta sequences. A data bus separately couples the output pins of the memory to the taps of the commutating modulators.

Figure 9:
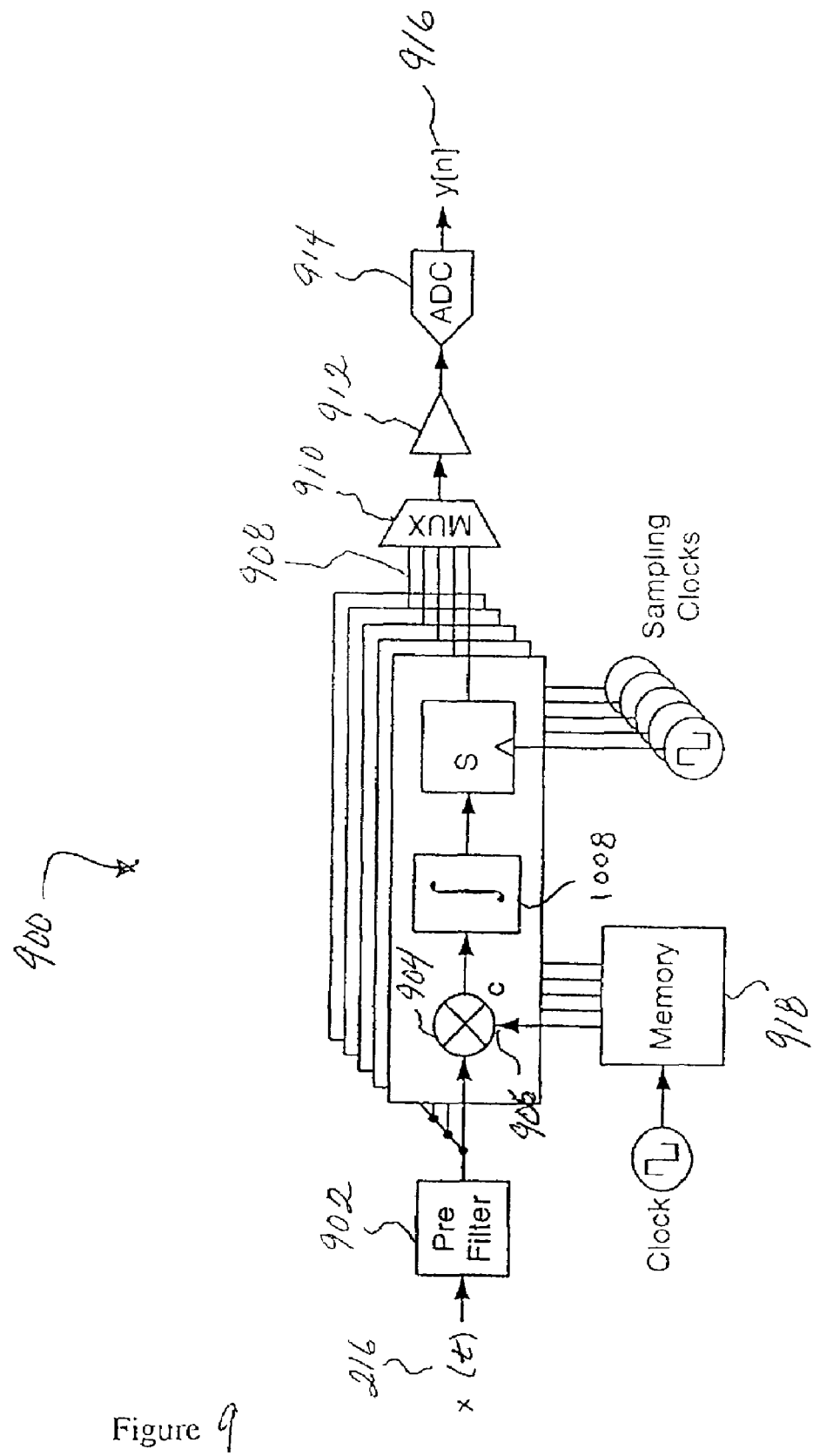
FIG. 9 is a block diagram of an alternative preferred embodiment incorporated within a communication receiver.

FIG. 9 illustrates a preferred embodiment 900 that is a unitary part of or is integrated within a communications receiver that can receive baseband signals or bandpass signals with symmetric or anti-symmetric sidebands (e.g., signals having a real baseband equivalent). In this preferred embodiment 900, the analog signal "x(t)" 216 is first filtered by a pre-filter 902 and then concurrently coupled to switching modulators 904 having control inputs 906 driven by sigma-delta sequences "s[n]." Preferably, the sigma delta sequences "s[n]" encode desired impulse responses. In the preferred embodiment 900, the sigma-delta sequences "s[n]" are stored in memory 918. The outputs 908 of the samplers are then multiplexed by one or more multiplexers (MUXs) 910, amplified by an amplifier 912, and digitized by an analog-to-digital converter (ADC) 914 to yield "y[n]" 916. Depending on the output response of the pre-filter 902, the analog signal "x(t)" 216 can have a bandpass or a baseband characteristic. In either preferred embodiment, the output signal "y[n]" 916 is a baseband signal.

In the embodiment of FIG. 9, the pre-filter 902 rejects all of the unwanted signals that fall outside of the frequency band in which the correlation receiver exhibits a high spectral resolution. In some instances, without a pre-filter, the out-of-band signals may not be sufficiently attenuated because of the spectral magnitude of the quantization noise that is encoded within the sigma-delta sequences "s[n]." However, because the sigma-delta sequences "s[n]" are an output of an over sampled process, the pre-filter 902 may have a relaxed characteristic.

Figure 10:
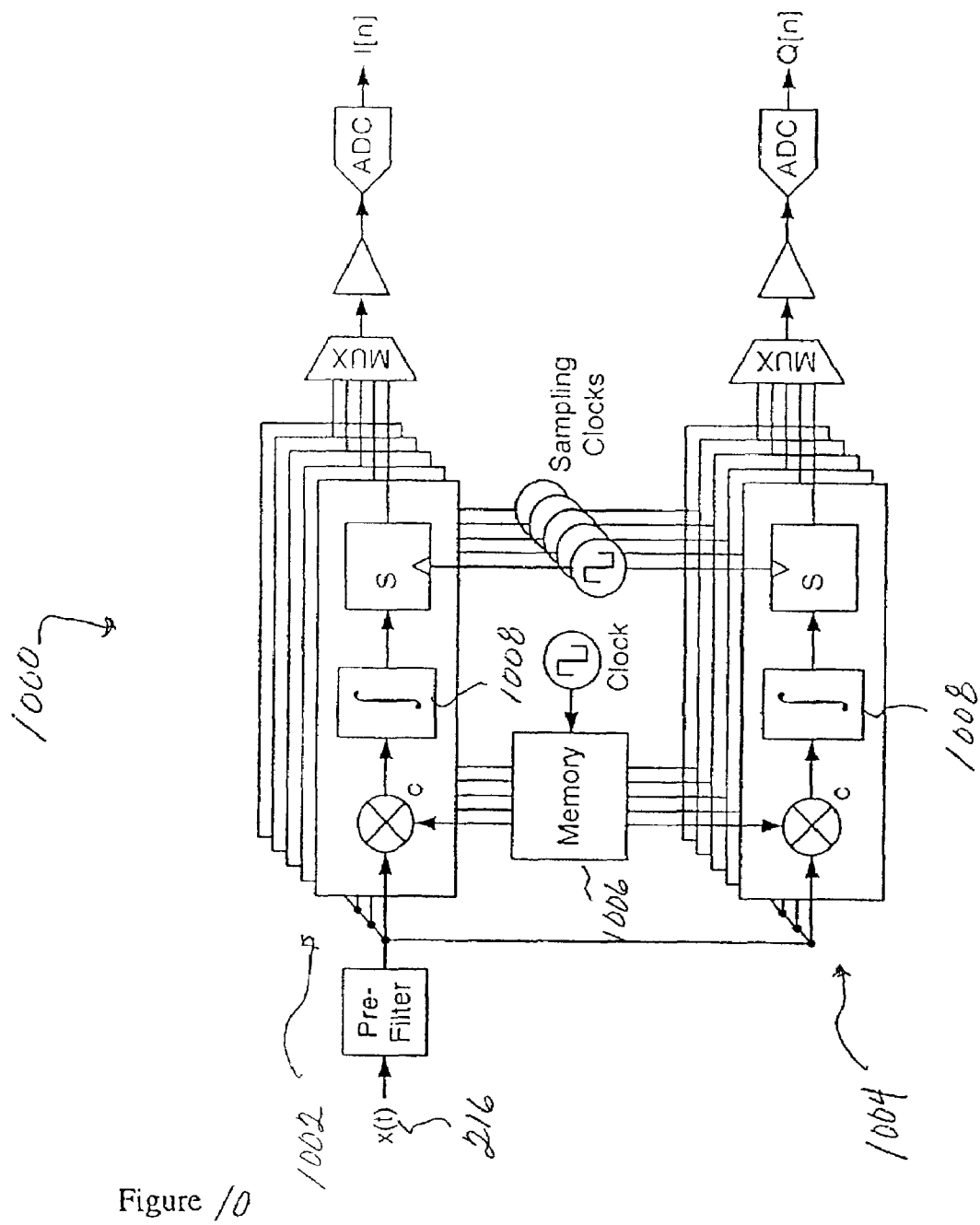
FIG. 10 is a block diagram of an alternative preferred embodiment incorporated within a complex communication receiver.

FIG. 10 illustrates a preferred embodiment 1000 that is a unitary part of or is integrated within a complex communication receiver that can receive a bandpass signal with asymmetric sidebands (e.g., with a complex baseband equivalent). This preferred embodiment 1000 makes use of two receivers 1002 and 1004 that process the analog signal "x(t)" 216 through parallel paths and separately interface one or more multiplexers that are coupled to an amplifier, which is coupled to an analog-to-digital converter. The first receiver 1002 computes the real (or in-phase) component of the baseband equivalent of the analog signal "x(t)" 216 using an in-phase modulating signal. The in-phase-modulating signal comprises an impulse response encoded as a sigma-delta sequence "s[n]." The second receiver 1004 computes the imaginary (or quadrature-phase) component of the baseband equivalent of the analog signal "x(t)" 216 using a similar quadrature-phase modulating signal. The in-phase and quadrature sigma-delta sequences are preferably stored in a common memory 1006, although separate memories may also be used. Alternatively, the sigma-delta sequences can be derived through sigma-delta modulators or by other means.

The preferred embodiments illustrated in FIGS. 10 and 11 can use other filters in place of or in addition to the integration filters 1008. Any suitable filter can be used, including but not limited to a lowpass filter, a band pass filter, an integrate-and-dump filter, and a resonate-and-dump filter. Furthermore, the receivers can receive many types of communication signals in addition to the baseband and bandpass signals described above and can realize many output filter responses.

While various preferred embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A communication receiver comprising:
   a modulating source comprising an output that generates an impulse response encoded as a sigma-delta sequence;
   a plurality of switching modulators each comprising a control input coupled to the modulating source and an input coupled to a communication signal;
   a plurality of analog filters each comprising an input coupled to at least one switching modulator; and
   a plurality of sampling circuits coupled to at least one of the analog filters.

2. The receiver of claim 1 wherein the modulating source effects a frequency conversion of the communication signal.

3. The receiver of claim 1 wherein the sigma-delta sequence comprises a bandpass characteristic.

4. The receiver of claim 1 further comprising multiple modulating sources comprising outputs coupled to at least one switching modulator.

5. The receiver of claim 1 wherein the plurality of analog filters comprise a plurality of integrate-and-dump filters.

6. The receiver of claim 1 wherein the plurality of analog filters comprise a plurality of resonate-and-dump filters.

7. The receiver of claim 1 wherein the plurality of analog filters comprise a plurality of lowpass filters.

8. The receiver of claim 1 wherein the plurality of analog filters comprise a plurality of bandpass filters.

9. The receiver of claim 1 further comprising a sigma-delta modulator coupled to the control input of at least one of the switching modulators.

10. The receiver of claim 1 further comprising a memory coupled to the control input of at least one of the switching modulators.

11. The receiver of claim 1 further comprising a multiplexer coupled to the plurality of sampling circuits.

12. The receiver of claim 11 further comprising an analog-to-digital converter coupled to an output of the multiplexer.

13. A receiver comprising:
   a first plurality of commutating modulators comprising control inputs configured to receive in-phase sequences of a modulating signal and analog signal inputs configured to receive a communication signal;
   a second plurality of commutating modulators comprising control inputs configured to receive quadrature-phase sequences of the modulating signal and analog signal inputs configured to receive the communication signal;
   a first plurality of analog filters coupled to the first plurality of commutating modulators;
   a second plurality of analog filters coupled to the second plurality of commutating modulators;
   a first plurality of sampling circuits coupled to the first plurality of analog filters; and
   a second plurality of sampling circuits coupled to the second plurality of analog filters, wherein the modulating signal comprises a filter impulse response encoded as a sigma-delta sequence.

14. The receiver of claim 13 wherein the modulating signal effects a frequency conversion of the communication signal.

15. The receiver of claim 13 wherein the communication signal comprises a bandpass signal.

16. The receiver of claim 13 wherein the communication signal comprises a baseband signal.

17. The receiver of claim 13 wherein at least one analog filter comprises an integrate-and-dump filter.

18. The receiver of claim 13 wherein at least one analog filter comprises a resonate-and-dump filter.

19. The receiver of claim 13 wherein at least one analog filter comprises a lowpass filter.

20. The receiver of claim 13 wherein at least one analog filter comprises a bandpass filter.

21. The receiver of claim 13 further comprising a sigma-delta modulator coupled to one of the control inputs of at least one of the first and the second plurality of commutating modulators.

22. The receiver of claim 13 further comprising a memory coupled to at least one of the control inputs of at least one of the first and the second plurality of commutating modulators.

23. The receiver of claim 22, further comprising a first multiplexer coupled to the first plurality of sampling circuits and a second multiplexer coupled to the second plurality of sampling circuits.

24. The receiver of claim 23, further comprising a first analog-to-digital converter coupled to the first multiplexer and a second analog-to-digital converter coupled to the second multiplexer.

25. A multi-mode communication receiver comprising:
an input configured to receive an analog signal;
a programmable modulating source comprising an output that generates an impulse response encoded as a sigma-delta sequence; and
a modulator comprising a multiplier having a first input coupled to the output of the modulating source and a second input coupled to the analog signal;
wherein the modulating source comprises a plurality of sigma-delta modulators that generate a plurality of sigma-delta sequences.

26. A multi-mode communication receiver comprising:
an input configured to receive an analog signal;
a programmable modulating source comprising an output that generates an impulse response encoded as a sigma-delta sequence;
a modulator comprising a multiplier having a first input coupled to the output of the modulating source and a second input coupled to the analog signal; wherein the modulating source comprises a plurality of sigma-delta modulaters that generate a plurality of sigma-delta sequences; and a multiplexer and an amplifier, the multiplexer being coupled to each sigma-delta modulator and to the amplifier.

27. In a multi-mode communication receiver, an improvement comprising a programmable filter for an analog signal coupled to a communications signal, comprising:
a plurality of modulating signals, wherein each of the modulating signals comprises a filter impulse response encoded as a sigma-delta sequence; and
a switching modulator having a control input coupled to at least one of the modulating signals and a signal input coupled to the analog signal;
wherein the switching modulator multiplies the analog signal at a frequency of at least one of the modulating signals.

28. The improvement of claim 27 further comprising a memory for storing the plurality of modulating signals.

29. The improvement of claim 28 wherein the receiver is programmed by selecting a modulating signal from the plurality of modulating signals.

30. The improvement of claim 27 further comprising a plurality of sigma-delta modulators for generating the plurality of modulating signals.

31. The improvement of claim 30 further comprising a multiplexer having inputs coupled to the plurality of sigma-delta modulators and an output coupled to an amplifier.

32. The improvement of claim 27 further comprising a memory for storing the plurality of modulating signals coupled to the control input.

33. The improvement of claim 27 further comprising a plurality of sigma-delta modulators that generate the plurality of modulating signals and a plurality of switching modulators having control inputs coupled to at least one of the modulating signals.

* * * * *